United States Patent
Nakatani et al.

(10) Patent No.: US 9,418,855 B2
(45) Date of Patent: Aug. 16, 2016

(54) METHOD OF MANUFACTURING SEMICONDUCTOR DEVICE, SUBSTRATE PROCESSING APPARATUS, AND NON-TRANSITORY COMPUTER-READABLE RECORDING MEDIUM

(71) Applicant: HITACHI KOKUSAI ELECTRIC INC., Tokyo (JP)

(72) Inventors: Kimihiko Nakatani, Toyama (JP); Kazuhiro Harada, Toyama (JP); Hiroshi Ashihara, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/667,063

(22) Filed: Mar. 24, 2015

(65) Prior Publication Data
US 2015/0279682 A1 Oct. 1, 2015

(30) Foreign Application Priority Data
Mar. 31, 2014 (JP) .................. 2014-071043

(51) Int. Cl.
| | |
|---|---|
| H01L 21/3205 | (2006.01) |
| H01L 21/4763 | (2006.01) |
| H01L 21/285 | (2006.01) |
| H01L 21/28 | (2006.01) |
| C23C 16/52 | (2006.01) |
| C23C 16/34 | (2006.01) |
| C23C 16/455 | (2006.01) |
| H01J 37/32 | (2006.01) |

(52) U.S. Cl.
CPC .......... *H01L 21/28506* (2013.01); *C23C 16/34* (2013.01); *C23C 16/45525* (2013.01); *C23C 16/52* (2013.01); *H01J 37/32449* (2013.01); *H01L 21/28088* (2013.01)

(58) Field of Classification Search
CPC ............ H01L 21/3205; H01L 21/4763; H01L 21/8238; H01L 21/28506; H01L 21/28088
USPC .................................................. 438/232, 585
See application file for complete search history.

(56) References Cited

U.S. PATENT DOCUMENTS

| | | | |
|---|---|---|---|
| 8,410,003 B2 | 4/2013 | Ota et al. | |
| 8,951,912 B2 | 2/2015 | Ogawa et al. | |
| 2004/0087143 A1* | 5/2004 | Norman | .................. C23C 10/60 438/680 |

(Continued)

FOREIGN PATENT DOCUMENTS

| | | |
|---|---|---|
| JP | 2011-006783 A | 1/2011 |
| KR | 10-2004-0020820 A | 3/2004 |

(Continued)

OTHER PUBLICATIONS

Ritala et al. "Atomic Layer Epitaxy Growth of TiN Thin Films from TiI4 and NH3" J. Electrochem. Soc. 145, 8, 1998.

*Primary Examiner* — Phuc Dang
(74) *Attorney, Agent, or Firm* — Volpe and Koenig, P.C.

(57) ABSTRACT

A halogen element-containing metal material and a nitrogen-containing material are alternately supplied to a process chamber with a flow rate of an inert gas supplied to the process chamber together with the nitrogen-containing material during the supplying of the nitrogen-containing material to the process chamber being more increased than a flow rate of the inert gas supplied to the process chamber together with the metal material during the supplying of the metal material to the process chamber.

6 Claims, 10 Drawing Sheets

(56) References Cited

U.S. PATENT DOCUMENTS

| | | | |
|---|---|---|---|
| 2006/0024881 A1* | 2/2006 | Marsh | C23C 16/40 438/232 |
| 2006/0154383 A1 | 7/2006 | Kannan et al. | |
| 2009/0104352 A1 | 4/2009 | Hasegawa | |
| 2009/0149008 A1* | 6/2009 | Kryliouk | C23C 16/303 438/503 |
| 2014/0099795 A1* | 4/2014 | Tobin | H01L 21/31116 438/715 |

FOREIGN PATENT DOCUMENTS

| | | |
|---|---|---|
| KR | 10-2008-0003920 A | 1/2008 |
| KR | 10-2012-0001619 A | 1/2012 |

\* cited by examiner

METHOD OF MANUFACTURING SEMICONDUCTOR DEVICE, SUBSTRATE PROCESSING APPARATUS, AND NON-TRANSITORY COMPUTER-READABLE RECORDING MEDIUM

BACKGROUND OF THE INVENTION

1. Field of the Invention

The present invention relates to a method of manufacturing a semiconductor device, a substrate processing apparatus, and a non-transitory computer-readable recording medium.

2. Description of the Related Art

Various kinds of metal films are used for a gate electrode of a transistor such as a metal-oxide-semiconductor field effect transistor (MOSFET) or a capacitor electrode of a dynamic random access memory (DRAM).

As a structure of a transistor, there is known a gate stack structure in which a high dialectic constant film is formed on a substrate and a gate electrode is formed on the high dialectic constant film. As the gate electrode, a metal film containing a metal element is known (see, for example, JP 2011-6783 A).

SUMMARY OF THE INVENTION

In terms of the performance of a transistor, it is desirable that electrical resistivity of a gate electrode is low. In particular, since reduction in the thickness of a metal film constituting a gate electrode is accompanied by an increase in electrical resistivity, there is a need to develop a metal film having a lower electrical resistivity.

Therefore, a main object of the present invention is to provide a metal film having a low electrical resistivity.

According to an aspect of the present invention, there is provided a method of manufacturing a semiconductor device, including: supplying a halogen-containing metal material containing a metal element and a halogen element to a substrate while supplying an inert gas; and supplying a reactant gas containing a nitrogen element to the substrate while supplying the inert gas at a flow rate larger than a flow rate of the inert gas supplied during the supplying of the reactant gas.

According to the present invention, it is possible to obtain a metal film having a low electrical resistivity.

DETAILED DESCRIPTION OF THE PREFERRED EMBODIMENTS

First Embodiment

Hereinafter, a first embodiment of the present invention will be described with reference to the drawings.

First, a substrate processing apparatus used in the present embodiment will be described. Specifically, the substrate processing apparatus is an apparatus for manufacturing a semiconductor device and is used in one process among processes of manufacturing the semiconductor device. As an example of the substrate processing apparatus, a single wafer type substrate processing apparatus is used herein. The single wafer type substrate processing apparatus performs a film-forming process or the like on a substrate one at a time.

(1) Configuration of Substrate Processing Apparatus

Figure 1:
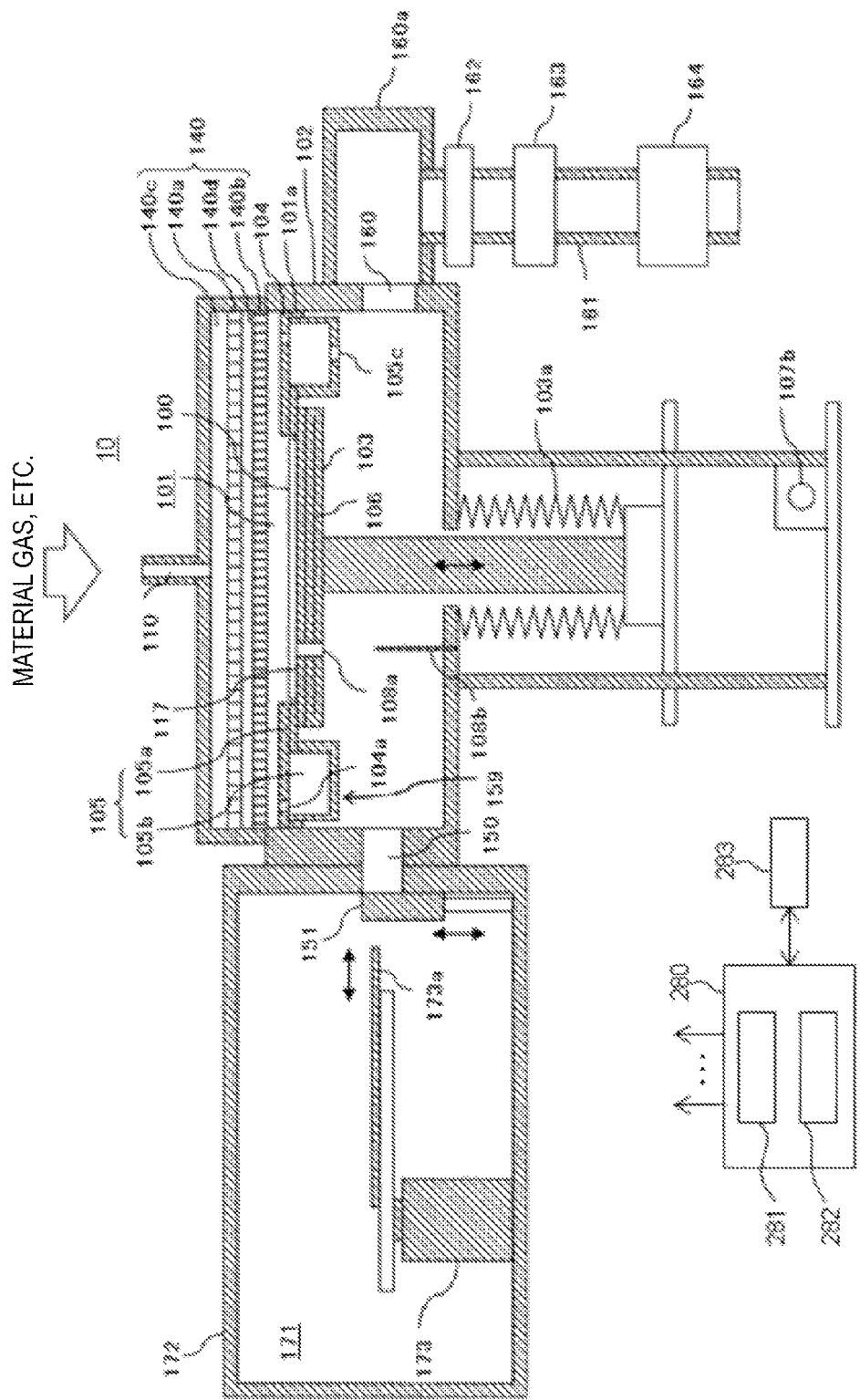
FIG. 1 is a schematic configuration diagram of a substrate processing apparatus that is suitably used in a first embodiment of the present invention.

FIG. 1 is a schematic configuration diagram of a substrate processing apparatus that is suitably used in the present embodiment.

<Process Chamber>

As illustrated in FIG. 1, the substrate processing apparatus 10 includes a process container 102. The process container 102 is configured as, for example, a flat sealed container having a circular shape in a top view. Also, the process container 102 is made of, for example, a metal material such as aluminum (Al) or stainless steel (SUS), or quartz ($SiO_2$). A process chamber 101 is formed within the process container 102. As a substrate, a wafer 100 such as a silicon wafer is processed in the process chamber 101.

<Support Table>

In the process container 102, a support table 103 is provided to support the wafer 100. The support table 103 is made of, for example, quartz ($SiO_2$), carbon, ceramics, silicon carbide (SiC), aluminum oxide ($Al_2O_3$), or aluminum nitride (AlN). On the top surface of the support table 103, a susceptor 117 is provided as a support plate made of, for example, quartz ($SiO_2$), carbon, ceramics, silicon carbide (SiC), aluminum oxide ($Al_2O_3$), or aluminum nitride (AlN), and the wafer 100 is placed on the susceptor 117. In the support table 103, a heater 106 is incorporated as a heating unit configured to heat the wafer 100. In addition, a lower end portion (pillar) of the support table 103 passes through the bottom of the process container 102.

<Elevating Mechanism>

An elevating mechanism 107b is connected to the lower end portion of the support table 103. By operating the elevating mechanism 107b, the support table 103 is elevated and the wafer 100 supported on the susceptor 117 is elevated. The support table 103 (susceptor 117) moves down to a height of a wafer transfer port 150 (described later) during the transfer of the wafer 100 and moves up to a wafer processing position (position illustrated in the drawing) during the processing of the wafer 100. A periphery of the lower end portion of the support table 103 is covered by bellows 103a and the inside of the process container 102 is airtightly maintained.

<Lift Pins>

Also, a plurality of lift pins 108b, for example, three lift pins 108b are provided on the inner bottom surface of the process container 102. Furthermore, in the support table 103 (including the susceptor 117), a plurality of through-holes 108a is provided at positions corresponding to the lift pins 108b, respectively. When the support table 103 is moved down to the wafer transfer position, upper ends of the lift pins 108b pass through the through-holes 108a and protrude from the top surface of the susceptor 117, and the lift pins 108b support the wafer 100 from below. In addition, when the support table 103 is moved up to the wafer processing position, the lift pins 108b are buried from the top surface of the susceptor 117, and the susceptor 117 supports the wafer 100 from below. Since the lift pins 108b directly contact the wafer 100, it is desirable that the lift pins 108b are made of, for example, a material such as quartz or alumina.

<Wafer Transfer Port>

In an inner wall side surface of the process container 102, the wafer transfer port 150 is provided so as to transfer the wafer 100 to the inside and outside of the process container 102. A gate valve 151 is provided in the wafer transfer port 150. By opening the gate valve 151, the inside of the process container 102 and the inside of a transfer chamber (preliminary chamber) 171 communicate with each other. The transfer chamber 171 is formed in a transfer container (sealed container) 172, and a transfer robot 173 configured to transfer the wafer 100 is provided in the transfer chamber 171. In the transfer robot 173, a transfer arm 173a is provided so as to support the wafer 100 when transferring the wafer 100.

By opening the gate valve 151 in such a state that the support table 103 is moved down to the wafer transfer position, the transfer robot 173 is enabled to transfer the wafer 100 between the process container 102 and the transfer chamber 171. The wafer 100 transferred into the process container 102 is temporarily placed on the lift pins 108b as described above. A load lock chamber (not illustrated) is provided on a side of the transfer container 172 opposite to a side where the wafer transfer port 150 is provided, and the transfer robot 173 is enabled to transfer the wafer 100 between the inside of the load lock chamber and the inside of the transfer chamber 171. The load lock chamber functions as a preliminary chamber that temporarily accommodates the wafer 100 before or after processing.

<Exhaust System>

In the inner wall side surface of the process container 102, an exhaust port 160 configured to exhaust the atmosphere inside the process container 102 is provided on an opposite side of the wafer transfer port 150. An exhaust pipe 161 is connected to the exhaust port 160 through an exhaust chamber 160a. An auto pressure controller (APC) 162 as a pressure regulator configured to control the process chamber 101 to a predetermined pressure, a material recovery trap 163, and a vacuum pump 164 are sequentially connected in series to the exhaust pipe 161. An exhaust system (exhaust line) is configured by, mainly, the exhaust port 160, the exhaust pipe 161, and the pressure regulator 162. The material recovery trap 163 and the vacuum pump 164 are provided in a semiconductor manufacturing factory side where the substrate processing apparatus 10 is installed, but may be provided in the substrate processing apparatus 10.

<Gas Inlet Port>

In an upper portion of the process container 102 (a top surface of a shower head 140 described later (ceiling wall)), a gas inlet port 110 configured to supply various gases into the process container 102 is provided. A gas supply system (described later) is connected to the gas inlet port 110.

<Shower Head>

A shower head 140 serving as a gas dispersion mechanism is provided between the gas inlet port 110 and the process chamber 101 in the process container 202. The shower head 140 includes a dispersion plate 140a configured to disperse gas introduced from the gas inlet port 110, and a shower plate 140b configured to further uniformly disperse a gas having passed through the dispersion plate 140a and supply the gas to the surface of the wafer 100 on the support table 103. In the dispersion plate 140a and the shower plate 140b, a plurality of holes is provided. The dispersion plate 140a is disposed to face the top surface of the shower head 140 and the shower plate 140b, and the shower plate 140b is disposed to face the wafer 100 on the support table 103. A space is provided between the top surface of the shower head 140 and the dispersion plate 140a, and a space is provided between the dispersion plate 140a and the shower plate 140b. Such spaces function as a first buffer space 140c configured to diffuse a gas supplied from the gas inlet port 110, and a second buffer space 140d configured to diffuse a gas having passed through the dispersion plate 140a.

<Exhaust Duct>

In the inner wall side surface of the process chamber 101, a stepped portion 101a is provided. The stepped portion 101a holds a conductance plate 104. The conductance plate 104 is configured as a ring-shaped plate with a hole accommodating the wafer 100 in an inner peripheral portion. In an outer peripheral portion of the conductance plate 104, a plurality of discharge ports 104a arranged in a circumferential direction at predetermined intervals is provided.

In an outer peripheral portion of the support table 103 in the process container 102, a lower plate 105 is locked. The lower plate 105 includes a ring-shaped concave portion 105b, and a flange portion 105a integrally provided in an upper portion of an inner peripheral side of the concave portion 105b. The concave portion 105b is provided to close a gap between the outer peripheral portion of the support table 103 and the inner wall side surface of the process chamber 101. In a portion near the exhaust port 160 in the bottom of the concave portion 105b, a plate exhaust port 105c is provided so as to discharge (distribute) a gas from the inside of the concave portion 105b toward the exhaust port 160 side. The flange portion 105a functions as a locking portion that is locked on the upper outer periphery of the support table 103. When the flange portion 105a is locked on the upper outer periphery of the support table 103, the lower plate 105 is elevated together with the support table 103 according to the elevation of the support table 103.

When the support table 103 is moved up to the wafer processing position, the conductance plate 104 closes an upper opening surface of the concave portion 105b of the lower plate 105, and an exhaust duct 159 having the inside of the concave portion 105b as a gas passage region is formed. It is preferable that the conductance plate 104 and the lower plate 105 are made of a material that can be held at a high temperature, for example, quart for high temperature and high load resistance, considering the case of etching a reaction product deposited on an inner wall of the exhaust duct 159 (the case of self-cleaning).

A gas flow in the process chamber 101 when the wafer 100 is processed will be described. The gas, which is supplied from the gas inlet port 110 to the shower head 140, passes through the first buffer space 140c and flows from the hole of the dispersion plate 140a to the second buffer space 140d, and also passes through the hole of the shower plate 140b and is supplied to the wafer 100 within the process chamber 101. The gas, which is supplied to the wafer 100, passes through the exhaust duct 159 disposed in the outer peripheral portion of the wafer 100 and is exhausted from the exhaust port 160 to the outside of the process chamber 101.

<Gas Supply System>

Figure 2:
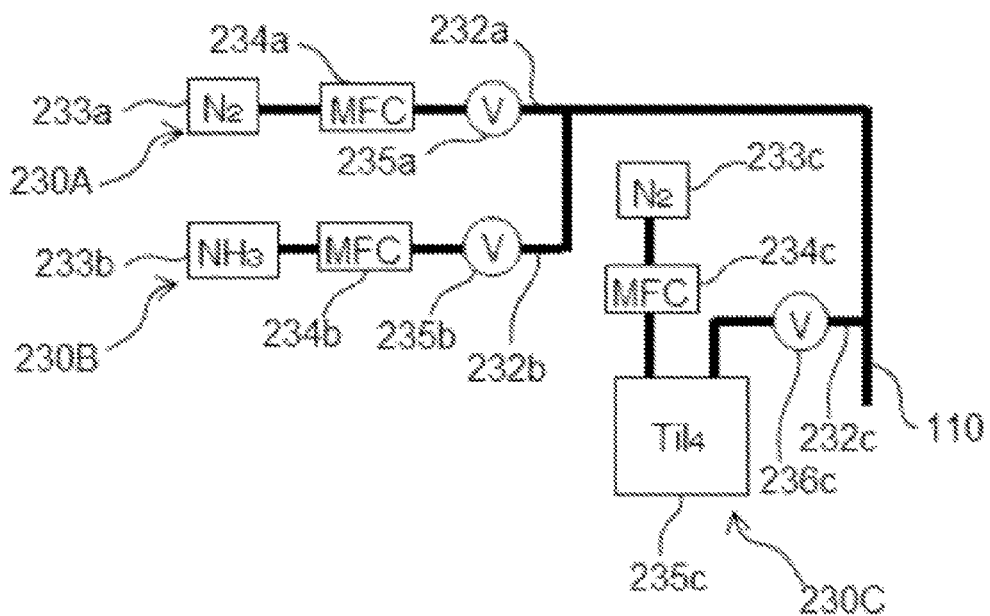
FIG. 2 is a schematic configuration diagram of a gas supply system of the substrate processing apparatus illustrated in FIG. 1.

Subsequently, the configuration of the gas supply system connected to the gas inlet port 110 described above will be described. FIG. 2 is a configuration diagram of the gas supply system of the substrate processing apparatus 10. The gas supply system of the substrate processing apparatus 10 includes an inert gas supply system 230A, a reactant gas supply system 230B, and a material gas supply system 230C, which are connected to the gas inlet port 110.

(Inert Gas Supply System)

The inert gas supply system 230A is configured by, mainly, a gas supply pipe 232a, an inert gas supply source 233a, a mass flow controller (MFC) 234a, and a valve 235a. A downstream side of the gas supply pipe 232a is connected to the gas inlet port 110. The inert gas supply source 233a, the MFC 234a, and the valve 235a are sequentially provided from an upstream side of the gas supply pipe 232a. In the present embodiment, nitrogen ($N_2$) gas is used as the inert gas.

The $N_2$ gas, which is introduced from the inert gas supply source 233a to the gas supply pipe 232a, is adjusted to a predetermined flow rate by the MFC 234a and is then supplied to the gas inlet port 110 through the valve 235a. In addition to the $N_2$ gas, the inert gas may be a rare gas, such as helium (He) gas, neon (Ne) gas, argon (Ar) gas, krypton (Kr) gas, or xenon (Xe) gas.

(Reactant Gas Supply System (Nitrogen-Containing Material Supply System))

The reactant gas supply system 230B is configured by, mainly, a gas supply pipe 232b, a reactant gas supply source 233b, an MFC 234b, and a valve 235b. A downstream side of the gas supply pipe 232b is connected to the gas inlet port 110. The reactant gas supply source 233b, the MFC 234b, and the valve 235b are sequentially provided from an upstream side of the gas supply pipe 232b. The reactant gas is a nitrogen-containing material and is used as a nitrogen source. In the present embodiment, ammonia ($NH_3$) is used as the nitrogen-containing material.

The $NH_3$ gas, which is introduced from the reactant gas supply source 233b to the gas supply pipe 232b, is adjusted to a predetermined flow rate by the MFC 234b and is then supplied to the gas inlet port 110 through the valve 235b. The reactant gas is not limited to the $NH_3$ gas. As the nitrogen-containing material, $N_2$, nitrous oxide ($N_2O$), or nitric oxide (NO) may be used. Furthermore, as the nitrogen-containing reactant gas, hydrazine, monomethylhydrazine, dimethylhydrazine, trimethylamine, dimethylamine, monomethylamine, triethylamine, diethylamine, or monoethylamine can also be used.

(Material Gas Supply System (Metal Material Supply System))

A metal material is supplied from the material gas supply system 230C. First, the metal material will be described. The metal material contains a halogen element and a metal element. The halogen element is preferably a halogen element having a larger atomic number than chlorine (Cl) and is any of bromine (Br), iodine (I), or astatine (At). In addition, the metal element is, for example, a transition metal element. In the present embodiment, iodine (I) is selected as the halogen element, and titanium (Ti) being the transition metal element is selected as the metal element. That is, in the present embodiment, titanium iodide (titanium tetraiodide ($TiI_4$)) is used as the metal material.

The material gas supply system 230C is configured by, mainly, a gas supply pipe 232c, a carrier gas supply source 233c, an MFC 234c, a material supply source 235c, and a valve 236c. A downstream side of the gas supply pipe 232c is connected to the gas inlet port 110. The carrier gas supply source 233c, the MFC 234c, and the material supply source 235c, and the valve 236c are sequentially provided from an upstream side of the gas supply pipe 232c. As the carrier gas, for example, $N_2$ gas is used. The material supply source 235c is configured as, for example, a vaporizer.

The carrier gas, which is introduced from the carrier gas supply source 233c to the gas supply pipe 232c, is adjusted to a predetermined flow rate by the MFC 234c and is then supplied to the material supply source 235c. Solid $TiI_4$ is accommodated in the material supply source 235c, and the vaporized gas is supplied to the gas inlet port 110 through the valve 236c together with the carrier gas. $TiI_4$ is a solid at a normal temperature and pressure and is vaporized by heating the material supply source 235c to a predetermined temperature (for example, 120° C.)

In the above, iodine (I) is exemplified as the halogen element, but bromine (Br) or astatine (At) may be used. Also, titanium (Ti), which is the transition metal element, is exemplified as the metal element, but the metal element is not limited thereto. The metal element may be selected from the group consisting of tungsten (W), tantalum (Ta), zirconium (Zr), hafnium (Hf), ruthenium (Ru), cobalt (Co), and nickel (Ni). Also, metal elements other than the transition metal may be used.

(Controller)

As illustrated in FIG. 1, the substrate processing apparatus 10 includes a controller (control unit) 280 configured to control each of the components of the substrate processing apparatus 10. The controller 280 includes at least a calculation unit 281 and a storage unit 282. The controller 280 is connected to each of the components described above. The controller 280 calls a program or a recipe from the storage unit 282 according to an instruction of an upper-level controller or a user and controls the operations of each of the components according to the contents of the instruction. Specifically, the controller 280 controls the operations of the heater 106, the elevating mechanism 107b, the gate valve 151, the APC 162, the vacuum pump 164, the transfer robot 173, the valve or the MFC of the gas supply system, and the like.

The controller 280 may be configured as a dedicated computer, or may be configured as a general-purpose computer. For example, the controller 280 according to the present embodiment can be configured by preparing an external memory device (for example, a magnetic tape, a magnetic disk such as a flexible disk or a hard disk, an optical disk such as a CD or a DVD, a magneto-optical disk such as an MO, or a semiconductor memory such as a USB flash drive or a memory card) 283, which stores the above-described program, and installing the program on a general-purpose computer by using the external memory device 283.

Also, a unit configured to provide the program to the computer is not limited to a case that provides the program through the external memory device 283. For example, the program may be provided without the external memory device 283 and by using a communication unit such as the Internet or a dedicated line. The storage unit 282 or the external memory device 283 is configured as a non-transitory computer-readable recording medium. Hereinafter, these will be simply collectively referred to as a recording medium. A case where the term "recording medium" is used in this specification is a case that includes only the storage unit 282, a case that includes only the external memory device 283, or a case that includes both the storage unit 282 and the external memory device 283.

<Configuration of Semiconductor Device>

Next, a configuration example of a gate of a transistor (semiconductor device) formed using the substrate processing apparatus 10 will be described. Here, an NMOS type transistor will be described as an example.

Figure 3:
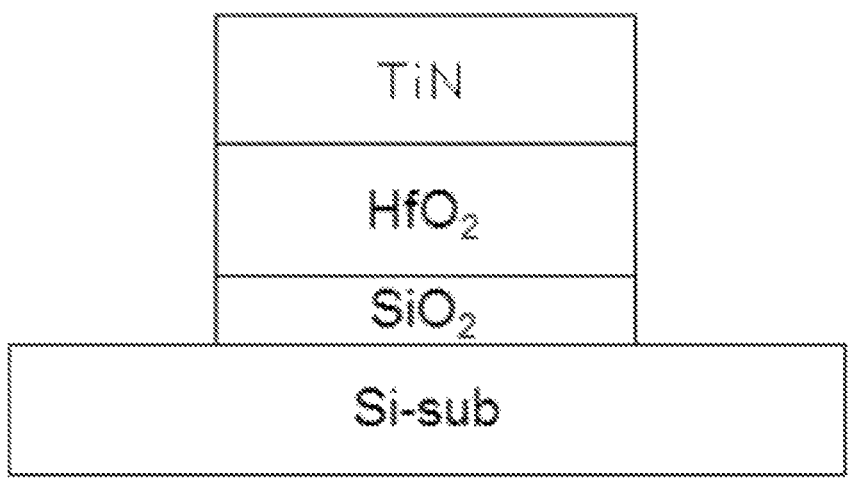
FIG. 3 is an explanatory diagram illustrating a configuration example of a gate of a transistor formed using the substrate processing apparatus illustrated in FIG. 1.

FIG. 3 is a diagram illustrating a configuration example of a gate of a transistor formed using the substrate processing apparatus 10. Specifically, FIG. 3 is a diagram illustrating a configuration example of a gate of an NMOS type transistor. As illustrated in FIG. 3, the gate has a stack structure formed by stacking a silicon-based insulation film made of silicon oxide ($SiO_2$) formed on a silicon substrate (Si-sub), a high dielectric constant film (a high-k film) made of hafnium oxide ($HfO_2$) formed on the $SiO_2$, and a gate electrode made of a metal nitride film (TiN) formed on the $HfO_2$.

<Process of Manufacturing Gate of Semiconductor Device>

Figure 4:
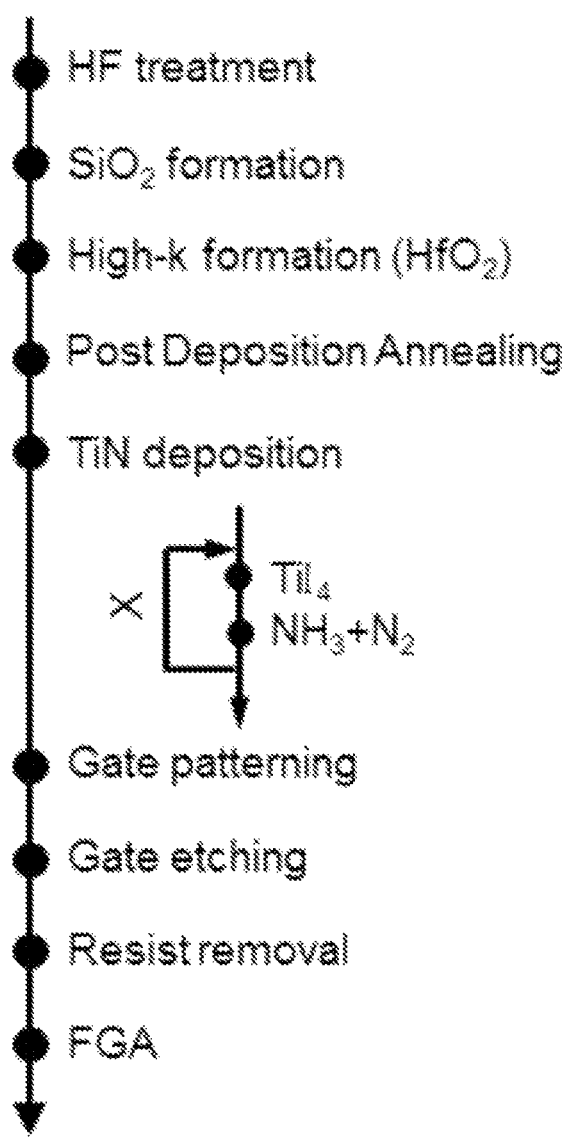
FIG. 4 is a process flow illustrating a process example of manufacturing the gate of the transistor illustrated in FIG. 3.

Next, a process example of manufacturing the gate of the transistor illustrated in FIG. 3 will be described. FIG. 4 is a processing flow illustrating a process example of manufacturing the gate of the transistor illustrated in FIG. 3.

As illustrated in FIG. 4, first, a sacrificial oxide film formed on a silicon substrate is removed by treating the silicon substrate by, for example, 1% HF aqueous solution ("HF treatment" process). Subsequently, silicon oxide ($SiO_2$) film is formed on the silicon substrate by thermal oxidizing ("$SiO_2$ formation" process). $SiO_2$ is formed as an interface layer in an interface between the silicon substrate and $HfO_2$ to be formed later.

Subsequently, hafnium oxide ($HfO_2$) as a high dialectic constant film is formed on the $SiO_2$ ("high-k formation" process). A gate insulation film is formed by the $SiO_2$ and the $HfO_2$. After the formation of the $HfO_2$ film, annealing treatment is performed ("post deposition annealing" process). The annealing treatment is performed for impurity removal from the $HfO_2$ and densification or crystallization of the $HfO_2$. Subsequently, a metal nitride film (TiN) as a gate electrode is deposited on the $HfO_2$ ("TiN deposition" process). As illustrated in the drawing, in this process, the TiN deposition process of supplying $TiI_4$ and $NH_3$ (and $N_2$) to the wafer 100 is performed X times. Here, X is an integer equal to or greater than 1.

Subsequently, patterning ("gate patterning" process) employing a photolithography technology using a resist as a mask is performed, and pattern etching ("gate etching" process) using a dry etching technology is performed. After that, the resist is removed ("resist removal" process). Then, a forming gas annealing (FGA) treatment such as a hydrogen gas annealing is performed ("FGA" process).

In the case of measuring a work function of TiN as the gate electrode, TiN is further deposited on the corresponding TiN, for example, by a physical vapor deposition (PVD), and it is possible to secure a film thickness necessary for the measurement of the work function. In this case, the TiN deposition by the PVD is performed before the "gate etching" process. Also, after the "FGA" process, an aluminum layer serving as a back contact may be formed on the back surface of the silicon substrate.

(2) Substrate Processing Process

Next, the above-described TiN deposition process ("TiN deposition" process of FIG. 4) will be described. In the following description, the operations of each of the components constituting the substrate processing apparatus 10 are controlled by the controller 280.

Figure 5:
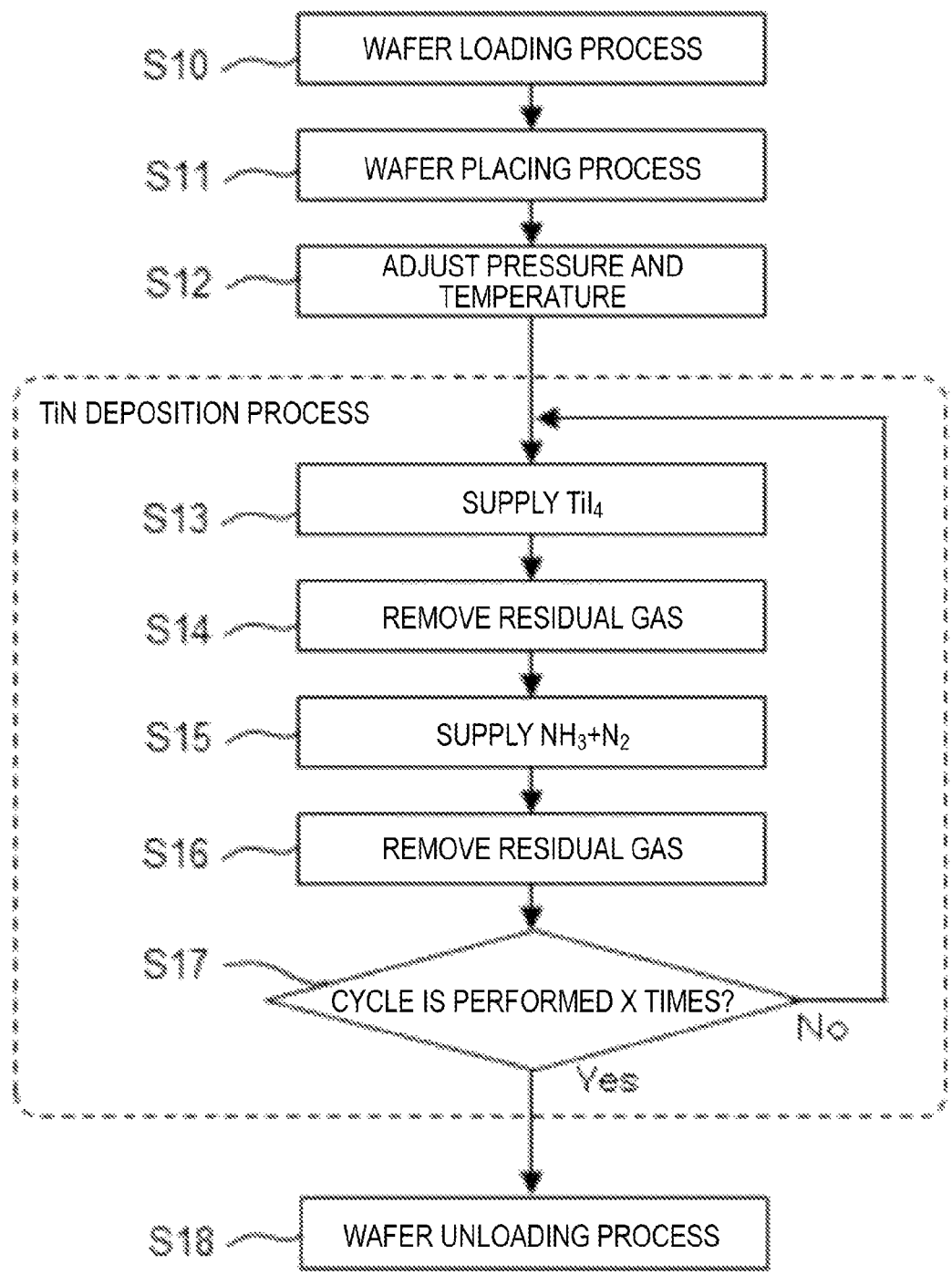
FIG. 5 is a process flow illustrating a process example of depositing a metal nitride film in the process flow illustrated in FIG. 4.

FIG. 5 is a process flow illustrating a processing example of a TiN deposition process in the process flow illustrated in FIG. 4.

A case where the term "wafer" is used in this specification includes a case that means a "wafer itself," and a case that means a "laminate (aggregate) of a wafer and a predetermined layer, film or the like formed on a surface of the wafer" (that is, a case that refers to a wafer including a predetermined layer, film or the like formed on a surface). Also, a case where the term "surface of a wafer" is used in this specification includes a case that means a "surface (exposed surface) of a wafer itself," and a case that means a "surface of a predetermined layer, film or the like formed on a wafer, that is, an outermost surface of a wafer as a laminate."

Therefore, a case where the expression "predetermined gas is supplied to a wafer" is described in this specification includes a case that means "predetermined gas is directly supplied to a surface (exposed surface) of a wafer itself," and a case that means "predetermined gas is supplied to a predetermined layer, film or the like formed on a wafer, that is, an outermost surface of a wafer as a laminate." Also, a case where the expression "predetermined film (or layer) is formed on a wafer" is described in this specification includes a case that means "predetermined film (or layer) is directly formed on a surface (exposed surface) of a wafer itself," and a case that means "predetermined film (or layer) is formed on a film, layer or the like formed on a wafer, that is, an outermost surface of a wafer as a laminate."

A case where the term "substrate" is used in this specification is the same as the case where the term "wafer" is used. In this case, in the above description, it may be considered that "wafer" is replaced with "substrate."

(Wafer Loading Process S10)

First, the gate valve 151 provided in the wafer transfer port 150 is opened and the wafer 100 is transferred from the transfer chamber 171 into the process container 102 by the transfer robot 173. The high dialectic constant film ($HfO_2$) described above is formed on the wafer 100 transferred into the process container 102. In addition to $HfO_2$, a film formed by one of aluminum oxide (AlO), zirconium oxide (ZrO), lanthanum oxide (LaO), yttrium oxide (YO), tantalum oxide (TaO), cerium oxide (CeO), titanium oxide (TiO), strontium titanate (STO), barium titanate (BTO), or a film formed by combining two or more of the listed materials may be used as the high dialectic constant film. Also, these films may be a film including silicon oxide (SiO) or silicon nitride (SiN).

(Wafer Placing Process S11)

The wafer 100 transferred into the process container 102 is placed on the lift pins 108b. Then, the support table 103 is moved up to the wafer processing position, and the wafer 100 is placed on the susceptor 117.

(Pressure and Temperature Adjusting Process S12)

When the wafer 100 is placed on the susceptor 117, the gate valve 151 is closed and the inside of the process chamber 101 is vacuum-exhausted to a desired pressure (degree of vacuum) by the vacuum pump 164. At this time, the pressure inside the process chamber 101 is measured by a pressure sensor (not illustrated) and is feedback controlled by the APC 162.

Also, the wafer 100, which is placed on the susceptor 117, is heated to a predetermined temperature by the heater 106 incorporated in the support table 103. A temperature sensor (not illustrated) is provided in the process container 102, and an amount of electricity supplied to the heater 106 is feedback controlled based on temperature information detected by the temperature sensor, such that the wafer 100 becomes a predetermined temperature.

The pressure regulation and the temperature regulation described above are always performed until the TiN deposition process described later is completed.

Subsequently, a TiN deposition process is performed.

<TiN Deposition Process>

In the TiN deposition process, the following four processes are sequentially performed.

(TiI$_4$ Supplying Process S13)

In the TiI$_4$ supplying process S13, TiI$_4$ is supplied to the process chamber 101 as a first metal material. Specifically, the valve 236c of the gas supply pipe 232c is opened and an N$_2$ gas as the carrier gas is supplied to the material supply source 235c. At this time, the carrier gas being supplied to the material supply source 235c is adjusted to a predetermined flow rate by the MFC 234c. TiI$_4$, which is vaporized in the material supply source 235c, is supplied to the process chamber 101 as the TiI$_4$ gas of the predetermined flow rate together with the carrier gas. At this time, the valve 235a of the inert gas supply system 230A may be opened and the N$_2$ gas of the predetermined flow rate may be supplied from the inert gas supply source 233a to the process chamber 101.

In this process, the pressure inside the process chamber 101 is set to a range of, for example, 20 to 1,330 Pa by the APC 162. Also, the flow rate of the TiI$_4$ gas, which is controlled by the MFC 234c (and the heater that heats the material supply source 235c), is a flow rate in a range of, for example, 1 to 200 sccm. In a case where the N$_2$ gas is supplied from the inert gas supply system 230A together with the TiI$_4$ gas, the flow rate of the N$_2$ gas, which is controlled by the MFC 234a, is a flow rate in a range of, for example, 0.1 to 2,000 sccm.

Also, the time to expose the wafer 100 to the TiI$_4$ gas, that is, the gas supply time (irradiation time), is in a range of, for example, 0.01 to 300 seconds. At this time, by controlling the heater 106, the temperature (processing temperature) of the wafer 100 is adjusted to a range of, for example, 350 to 400° C., and preferably to 400° C. By supplying the TiI$_4$ gas, for example, a Ti-containing layer having a thickness of less than one atomic layer to a several atomic layer is formed on the wafer 100.

(Residual Gas Removing Process S14)

In the residual gas removing process S14, the valve 236c is closed and the supply of TiI$_4$ gas into the process chamber 101 is stopped. At this time, while the APC 162 is being opened, the inside of the process chamber 101 is vacuum-exhausted by the vacuum pump 164, and an unreacted gas remaining in the process chamber 101 or TiI$_4$ gas after contributing to the formation of the Ti-containing layer is removed from the process chamber 101. At this time, the valve 235a is opened (or left open) and the N$_2$ gas is supplied from the inert gas supply system 230A into the process chamber 101. The N$_2$ gas can act as a purge gas and the TiI$_4$ gas remaining in the process chamber 101 can be more effectively removed from the process chamber 101. The purge process is performed by supplying the N$_2$ gas, for example, at a flow rate of 100 to 2,000 sccm for 1 to 60 seconds.

(NH$_3$ Supplying Process S15)

In the NH$_3$ supplying process S15, NH$_3$ gas is supplied to the process chamber 101 as a reactant gas. Specifically, the valve 235b of the gas supply pipe 232b is opened and NH$_3$ gas stored in the reactant gas supply source 233b is supplied to the gas supply pipe 232b. The NH$_3$ gas, which flows through the gas supply pipe 232b, is adjusted to a predetermined flow rate by the MFC 234b. The NH$_3$ gas, the flow rate of which is adjusted, is supplied to the process chamber 101 through the gas inlet port 110. At this time, the valve 235a of the inert gas supply system 230A is opened and the N$_2$ gas of the predetermined flow rate is supplied from the inert gas supply source 233a to the process chamber 101 together with the NH$_3$ gas. Also, at this time, the flow rate of the N$_2$ gas supplied from the inert gas supply system 230A is increased more than the flow rate (including a case where the flow rate is zero) of the N$_2$ gas supplied from the inert gas supply system 230A during the supplying of the TiI$_4$ gas, or the flow rate (including a case in which the flow rate is zero) of the N$_2$ gas supplied from the inert gas supply system 230A during the purge process. In the present process, the N$_2$ gas supplied from the inert gas supply system 230A is supplied additionally (supplementarily) so as to effectively remove by-products by increasing the total flow rate of the supply gas in the present process. For example, the purpose is different from the purpose of the inert gas supplied for backflow prevention or the like.

In this process, the pressure inside the process chamber 101 is set to a range of, for example, 20 to 1,330 Pa by the APC 162. Also, the flow rate of the NH$_3$ gas, which is controlled by the MFC 234b, is set to a flow rate in a range of, for example, 10 to 3,000 sccm. Also, the N$_2$ gas, which is supplied together with the NH$_3$ gas, is controlled to a flow rate in a range of, for example, 0.1 to 2,000 sccm, and preferably ½ or more of a flow rate of the NH$_3$ gas.

Furthermore, the time to expose the wafer 100 to the NH$_3$ gas, that is, the gas supply time (irradiation time), is set to a time in a range of, for example, 0.01 to 300 seconds. At this time, the heater 106 is controlled such that the temperature (processing temperature) of the wafer 100 is set to a temperature in a range of, for example, 350 to 400° C., and preferably to a temperature of 400° C.

The NH$_3$ gas, which is supplied to the process chamber 101, reacts with at least a part of the Ti-containing layer formed on the wafer 100 in step S13. Accordingly, the Ti-containing layer is nitrided to form TiN.

(Residual Gas Removing Process S16)

In the residual gas removing process S16, the valve 235b is closed to stop the supply of the NH$_3$ gas into the process chamber 101. At this time, while the APC 162 is being opened, the inside of the process chamber 101 is vacuum-exhausted by the vacuum pump 164. The unreacted gas remaining in the process chamber 101 or the NH$_3$ gas after contributing to the nitridation of the Ti-containing layer is removed from the process chamber 101. At this time, the valve 235a is opened (or left open) and N$_2$ gas is supplied into the process chamber 101. The N$_2$ gas acts as a purge gas and the NH$_3$ gas remaining in the process chamber 101 can be more effectively removed from the process chamber 101. The purge process is performed by supplying the N$_2$ gas, for example, at a flow rate of 100 to 2,000 sccm for 1 to 60 seconds.

(Cycle Number Determining Process S17)

In the cycle number determining process S17, it is determined whether a series of processes including steps S13 to S16 described above, which is defined as one cycle, is performed a first predetermined number of times X, and the processes of steps S13 to S16 are performed until it is determined that the series of processes is performed the first predetermined number of times X. Here, X is an integer equal to or greater than 1. The TiN deposition process is completed by performing the cycle of steps S13 to S16 X times.

In this way, by performing the processes of steps S13 to S16 once or more cycles, TiN of a predetermined film thickness (for example, 0.01 to 20 nm) is formed. In the above, the TiI$_4$ gas is supplied before the NH$_3$ gas, but the NH$_3$ gas may be supplied before the TiI$_4$ gas.

(Wafer Unloading Process S18)

When the TiN deposition process is completed, the processing proceeds to the wafer unloading process S18. In the wafer unloading process S18, the support table 103 is moved down, the gate valve 151 is opened, and the processed (film-formed) wafer 100 is unloaded to the outside of the process container 102 by the transfer robot 173.

Figure 6:
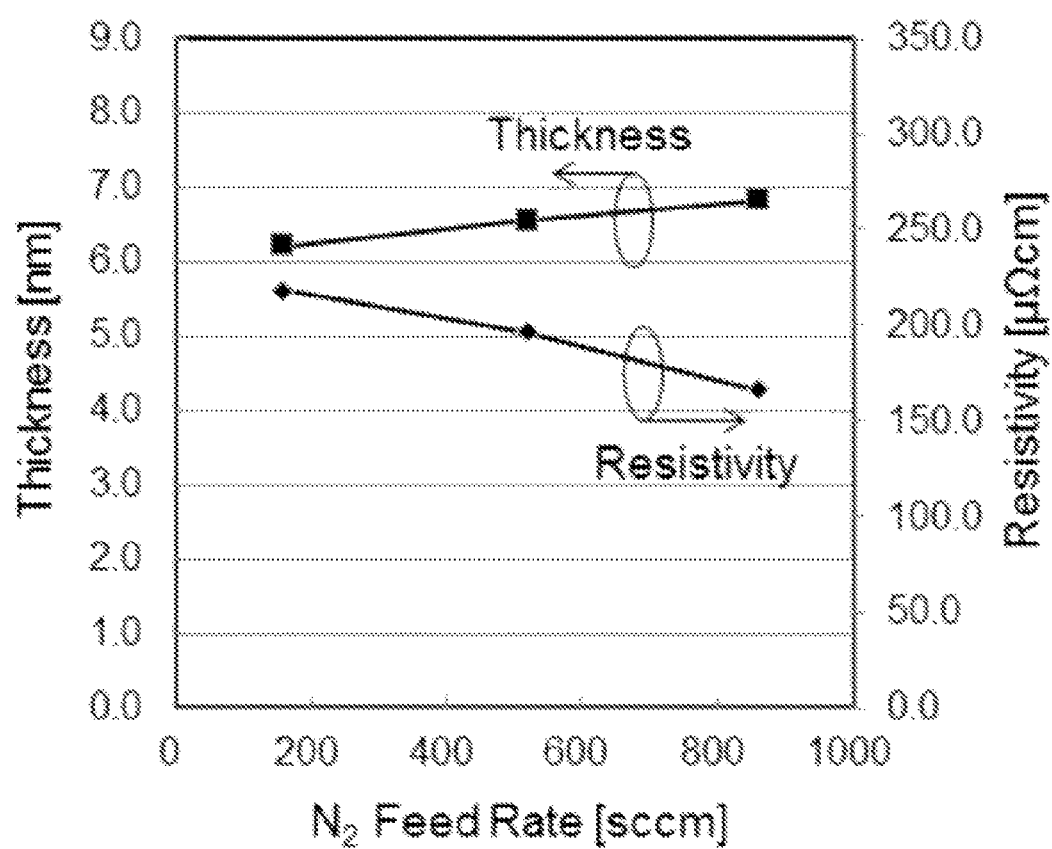
FIG. 6 is a diagram illustrating a relationship between a flow rate of an $N_2$ gas supplied together with an $NH_3$ gas and an electrical resistivity and a film thickness of TiN.

FIG. 6 is a diagram illustrating a relationship between the flow rate of the $N_2$ gas, which is supplied together with the $NH_3$ gas in the $NH_3$ supplying process S15 described above, and the electrical resistivity and the film thickness of TiN. The TiN deposition conditions when the values shown in FIG. 6 are obtained are as follows.

Processing temperature (deposition temperature): 400° C.
Processing pressure (during supply of $TiI_4$ gas): 30 Pa
Processing pressure (during supply of $NH_3$ gas): 60 Pa
Supply time of $TiI_4$ gas: 15 sec
Flow rate of $TiI_4$ gas (including carrier gas): about 0.6 sccm
Flow rate of $N_2$ gas (except for carrier gas) supplied together with $TiI_4$ gas: 160 sccm
Supply time of $NH_3$ gas: 20 sec
Flow rate of $NH_3$ gas: 300 sccm
Flow rate of $N_2$ gas supplied together with $NH_3$ gas: 160 to 860 sccm
Flow rate of $N_2$ gas during purge process: 160 sccm Number (X) of process cycles: 150

As illustrated in FIG. 6, as the flow rate of the $N_2$ gas supplied together with the $NH_3$ gas is increased, the electrical resistivity is reduced. The reason for this is described below. Generally, in a case where a metal nitride film is formed using a halogen element-containing metal material, a part of the halogen element contained in the metal material is incorporated in the corresponding metal nitride film as a residue. The halogen element as the residue causes the electrical resistivity to increase. In TiN, which is the most typical metal nitride film at present and is formed using $TiCl_4$ as a material, chlorine (Cl) as a residue causes the electrical resistivity to increase. It can be seen that as the content ratio of chlorine (Cl) in TiN increases, the electrical resistivity increases. Therefore, it is considered that reducing the halogen element incorporated in TiN is one of methods of reducing the electrical resistivity.

In a case where a metal nitride film is formed by alternately supplying a halogen element-containing metal material and a nitrogen-containing material, it is observed that the halogen elements are desorbed from the metal material when the metal element-containing layer is formed, but some of the halogen elements are adsorbed again on the surface of the wafer as by-product and are incorporated in the film. Therefore, in the present invention, during the supplying of the $NH_3$ gas, the $N_2$ gas is supplied together with the $NH_3$ gas, and thus, the total flow rate of the gas supplied in the $NH_3$ gas supplying process is increased. Iodine (I) desorbed from $TiI_4$ (specifically, hydrogen iodide (HI) that is a compound of iodine (I) and hydrogen (H)) is effectively removed from the surface of the wafer 100, and it is possible to suppress iodine (I) from being contained in TiN, thereby reducing the electrical resistivity.

As illustrated in FIG. 6, as the flow rate of the $N_2$ gas supplied together with the $NH_3$ gas is increased, the electrical resistivity is reduced. In other words, when the flow rate of the $N_2$ gas is small, the effect that reduces the electrical resistivity is lowered. The inventors of the present application found that when the flow rate of the $N_2$ gas supplied together with the $NH_3$ gas is equal to or greater than ½ of the flow rate of the $NH_3$ gas (around a region having the smallest flow rate of the $N_2$ gas in the electrical resistivity characteristic illustrated in FIG. 6), the electrical resistivity is significantly reduced. Therefore, it is desirable that the flow rate of the $N_2$ gas supplied together with the $NH_3$ gas is equal to or greater than ½ of the flow rate of the $NH_3$ gas.

In addition, as illustrated in FIG. 6, when the flow rate of the $N_2$ gas supplied together with the $NH_3$ gas is increased, the film thickness is increased. This means that when the flow rate of the $N_2$ gas supplied together with the $NH_3$ gas is increased, the deposition rate of TiN is improved. Generally, the deposition rate (in particular, the deposition rate in the non-saturation region before the reaction of gas occurring on the surface of the wafer is saturated) depends on the product of the partial pressure and the exposure time (supply time) of the material gas (or the reactant gas). Therefore, it is expected that when the flow rate of the $N_2$ gas supplied together with the $NH_3$ gas is increased, the partial pressure of the $NH_3$ gas is reduced and the deposition rate of TiN is reduced. On the contrary, the reason why the deposition rate of TiN is improved when the flow rate of the $N_2$ gas supplied together with the $NH_3$ gas is increased is considered as follows.

In a case where the metal nitride film is formed by alternately supplying the halogen element-containing metal material and the nitrogen-containing material, as described above, some of the halogen elements desorbed from the metal material are absorbed again on the surface of the wafer. Thus, the reaction of $NH_3$ supplied subsequently to the metal material is inhibited and the deposition rate is reduced. On the contrary, during the supplying of the $NH_3$ gas, the total flow rate of the supply gas is increased by supplying the $N_2$ gas together with the $NH_3$ gas, and iodine (I) (hydrogen iodide (HI)) can be effectively removed from the surface of the wafer. Accordingly, the reaction inhibition of $NH_3$ is reduced and the deposition rate is improved. The inventors of the present application found that when the flow rate of the $N_2$ gas supplied together with the $NH_3$ gas is equal to or greater than ½ of the flow rate of the $NH_3$ gas, the film thickness (deposition rate) is significantly improved. Therefore, in terms of the deposition rate, it is desirable that the flow rate of the $N_2$ gas supplied together with the $NH_3$ gas is equal to or greater than ½ of the flow rate of the $NH_3$ gas. However, as described above, since the deposition rate depends on the product of the partial pressure and the exposure time of the material gas (or the reactant gas), the reduction of the deposition rate is caused when the flow rate of the $N_2$ gas supplied together with the $NH_3$ gas is excessive. The inventors of the present application found that when the flow rate of the $N_2$ gas supplied together with the $NH_3$ gas is about three times the flow rate of the $NH_3$ gas (around a region having the largest flow rate of the $N_2$ gas in the characteristic illustrated in FIG. 6), both of the extremely low electrical resistivity and the improved deposition rate could be achieved.

Figure 7:
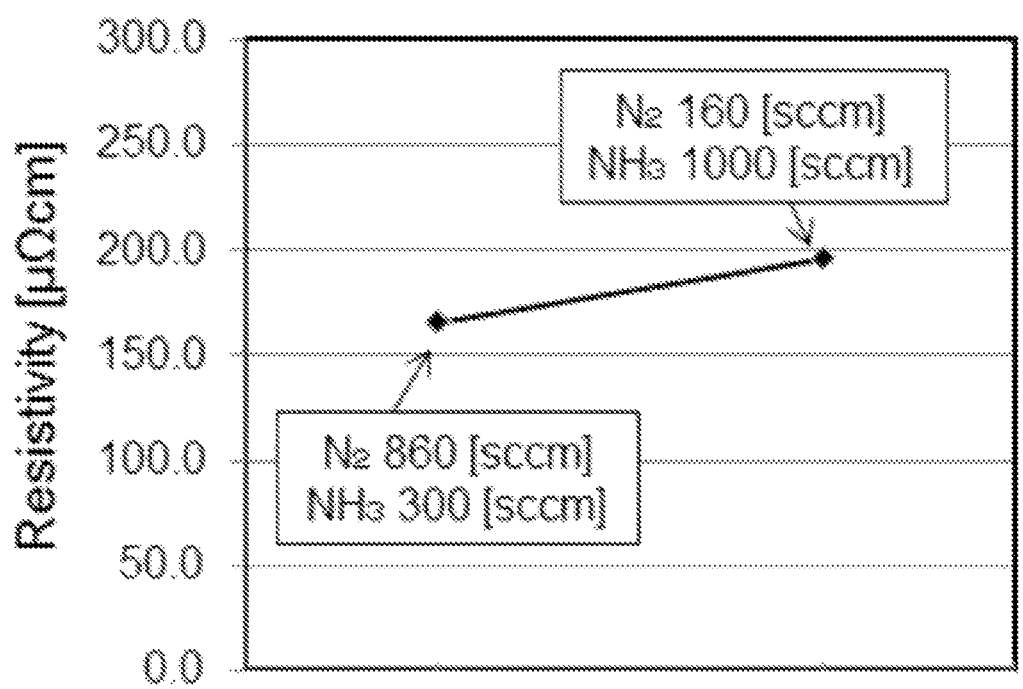
FIG. 7 is a diagram illustrating a relationship between a partial pressure and an electrical resistivity of an $NH_3$ gas.

The total flow rate of the supply gas can be increased by increasing the flow rate itself of the $NH_3$ gas. However, in this case, many by-products (ammonium halide) are generated in a short time by the reaction between the halogen element remaining on the surface of the wafer 100 and the $NH_3$ gas. The by-products, which remain on the surface of the wafer and are incorporated in the film, cause the deterioration of the electrical resistivity. FIG. 7 is a diagram illustrating the relationship between the partial pressure of the $NH_3$ gas and the electrical resistivity. As illustrated in FIG. 7, when the partial pressure of the $NH_3$ gas is increased while the total flow rate is kept constant, the electrical resistivity is increased. Therefore, instead of increasing the flow rate itself of the $NH_3$ gas, it is desirable to increase the total flow rate by adding the supply of the inert gas. In other words, instead of simply increasing the flow rate, it is desirable to increase the flow rate while maintaining the partial pressure of the $NH_3$ gas.

Figure 8:
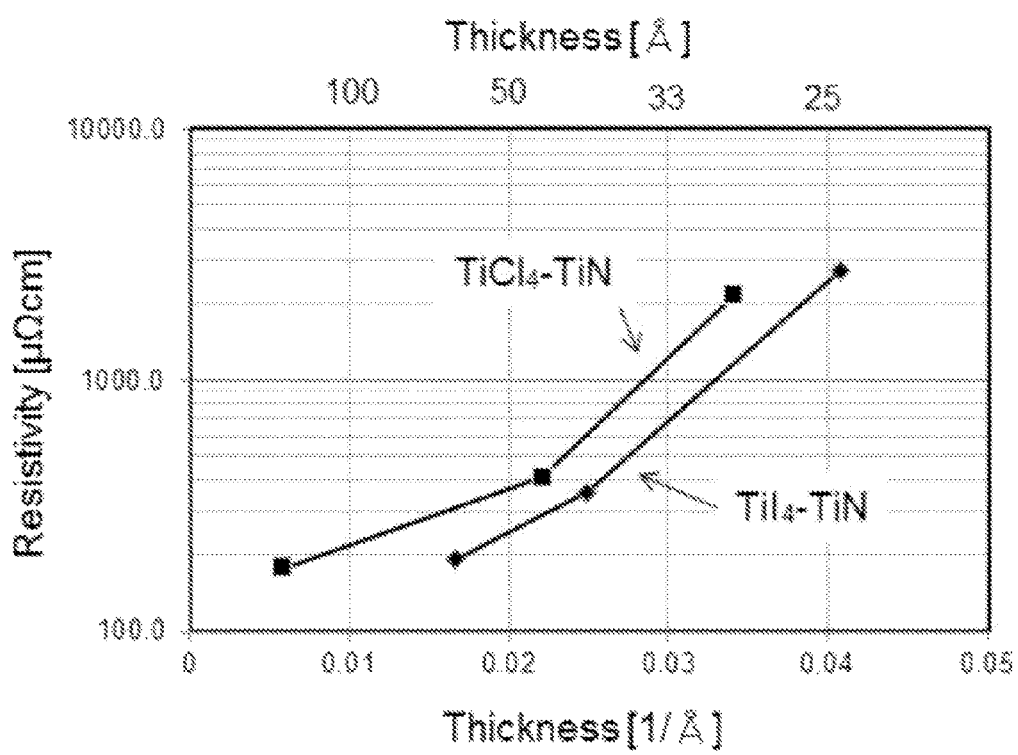
FIG. 8 is a diagram illustrating an electrical resistivity in the case of using $TiI_4$ and $TiCl_4$ as a metal material for forming TiN.
Figure 9:
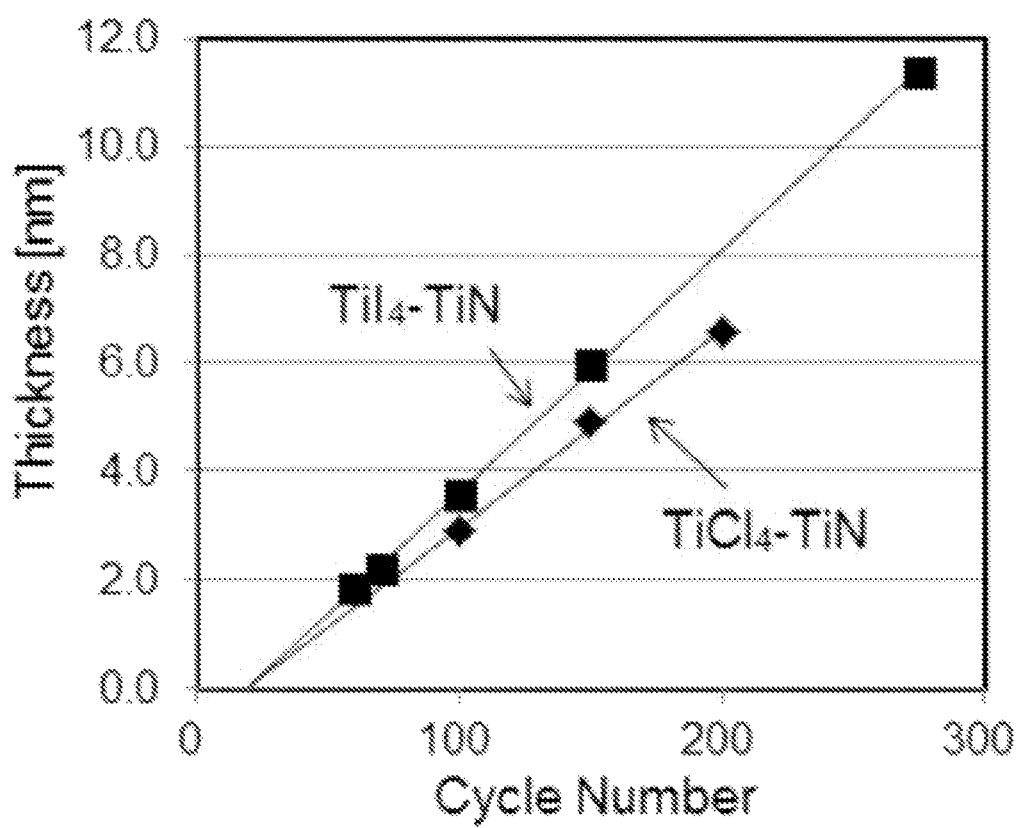
FIG. 9 is a diagram illustrating a film thickness in the case of using $TiI_4$ and $TiCl_4$ as a metal material for forming TiN.

FIG. 8 is a diagram illustrating the electrical resistivities in the case of using TiI$_4$ described above and TiCl$_4$ as the metal material for forming TiN. Also, FIG. 9 is a diagram illustrating the film thicknesses in the case of using TiI$_4$ and TiCl$_4$ as the metal material for forming TiN. As illustrated in FIGS. 8 and 9, the case of using TiI$_4$ as the metal material shows better values in the electrical resistivity and the film thickness (deposition rate) than the case of using TiCl$_4$ as the metal material. It is considered that this is because the binding energy of the halogen element in TiI$_4$ is smaller than the binding energy in TiCl$_4$. That is, since the case of using TiI$_4$ further accelerates the desorption of the halogen element, the halogen element can be more effectively removed by supplying the N$_2$ gas together with the NH$_3$ gas as described above and can more effectively improve the electrical resistivity and the film thickness (deposition rate) than the case of using TiCl$_4$ as the material. The binding energy of the halogen element is reduced as the atomic number of the halogen element increases. As an example, the binding energy of titanium (Ti) and chlorine (Cl) in TiCl$_4$ is 494 [kJ/mol], whereas the binding energy of titanium (Ti) and iodine (I) in TiI$_4$ is 310 [kJ/mol]. Therefore, the electrical resistivity and the deposition rate can be more effectively improved by using TiI$_4$ instead of TiCl$_4$, which is a conventional typical material of TiN, and supplying the N$_2$ gas at a predetermined flow rate together with the NH$_3$ gas. Even in the case of using TiCl$_4$, the inventors of the present application confirmed that the electrical resistivity and the deposition rate could be improved in such a manner that the total flow rate was increased by additionally supplying the N$_2$ gas during the supplying of TiCl$_4$.

Figure 10:
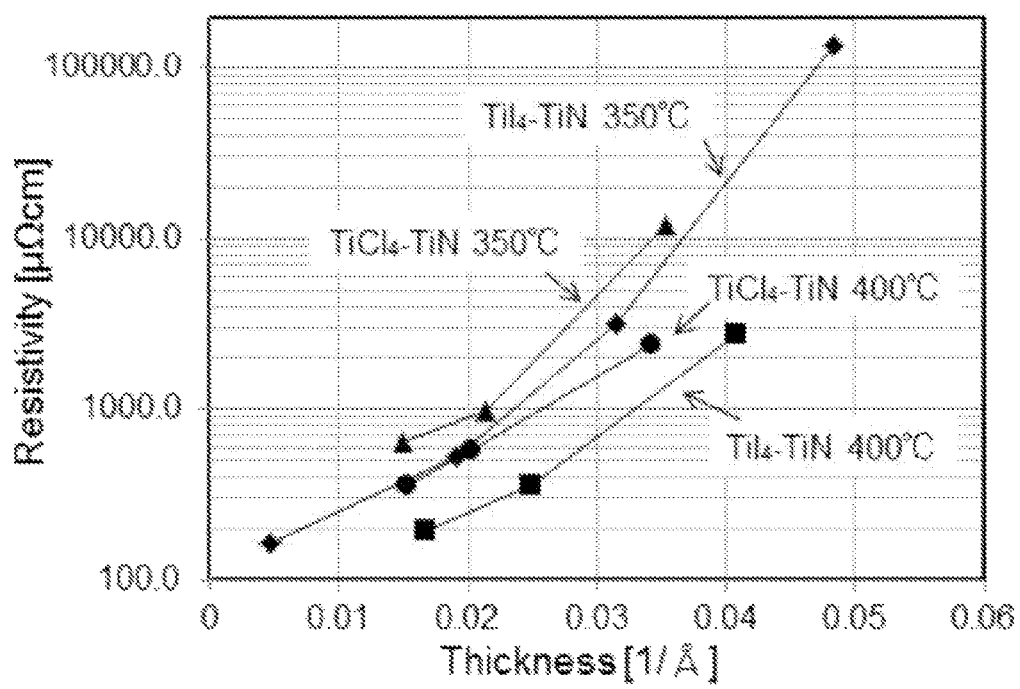
FIG. 10 is a diagram illustrating a relationship between a processing temperature and an electrical resistivity of a wafer.

FIG. 10 is a diagram illustrating the relationship between the processing temperature and the electrical resistivity of the wafer. FIG. 10 illustrates the electrical resistivities when the processing temperatures are 350° C. and 400° C. in each of the cases of using TiI$_4$ and TiCl$_4$ as the material of TiN. As illustrated in FIG. 10, the electrical resistivity is lower in the case of using TiI$_4$ as the material than in the case of using TiCl$_4$, regardless of the processing temperature. In addition, in both the case of using TiI$_4$ as the material and the case of using TiCl$_4$ as the material, the electrical resistivity is lower at the processing temperature of 400° C. than that at the processing temperature of 350° C. For example, in a replacement gate in which a gate electrode is incorporated by forming a source and a drain after creating a dummy gate, and removing the dummy gate, it is desirable that the processing temperature when forming the gate electrode is 400° C. or less so as to suppress a variation of a work function or the like. As illustrated in FIG. 10, since the electrical resistivity is lower in a case where the processing temperature is higher, it is desirable that the processing temperature is 400° C. so as to satisfy the above-described device manufacturing requirements and obtain low electrical resistivity. However, in the case of using TiI$_4$ as the material of TiN, since a sufficiently low electrical resistivity can be obtained even when the processing temperature is 350° C., a temperature in a range of 350° C. to 400° C. can be appropriately used as the processing temperature (temperature of the wafer 100).

As described above, in the present embodiment, the N$_2$ gas is additionally supplied during the supplying of the NH$_3$ gas, that is, the flow rate of the N$_2$ gas supplied from the inert gas supply system 230A during the supplying of the NH$_3$ gas is more increased than that during the supplying of the TiI$_4$ gas or performing the purge process. The N$_2$ gas, the flow rate of which is the same as the flow rate of the N$_2$ gas supplied from the inert gas supply system 230A during the supplying of the NH$_3$ gas can be supplied at other processing, but it is desirable to increase the flow rate during the supplying of the NH$_3$ gas in consideration of the amount of the N$_2$ gas consumed.

The pressure in the process chamber 101 during the supplying of the NH$_3$ gas may be the same as that in the process of supplying the TiI$_4$ gas or may be varied. That is, in the former case, the flow velocity of the supply gas can be actively increased by additionally supplying the N$_2$ gas during the supplying of the NH$_3$ gas. In the latter case, the pressure inside the process chamber 101 is increased by adding the supply of the N$_2$ gas during the supplying of the NH$_3$ gas. In any case, the removal of the by-product is accelerated and the electrical resistivity is improved.

Also, in the above, although the N$_2$ gas is additionally supplied during the supplying of the NH$_3$ gas, the N$_2$ gas may be additionally supplied during the supplying of the TiI$_4$ gas (that is, the flow rate of the N$_2$ gas supplied from the inert gas supply system 230A during the supplying of the TiI$_4$ gas is more increased than that during the supplying of the NH$_3$ gas or performing the purge process). Furthermore, the supply amount of the N$_2$ gas added during the supplying of the NH$_3$ gas and the supply amount of the N$_2$ gas added during the supplying of the TiI$_4$ gas may be more increased than those during the purge process. In this case, the magnitude relationship between the supply amount of the N$_2$ gas added during the supplying of the NH$_3$ gas and the supply amount of the N$_2$ gas added during the supplying of the TiI$_4$ gas is not necessarily limited. In this manner, in at least one of the process of supplying the TiI$_4$ gas and the process of supplying the NH$_3$ gas, it is possible to accelerate the removal of the by-product generated by the reaction between the hydrogen iodide (HI) or the NH$_3$ gas and the halogen element, and the electrical resistivity and the deposition rate can be improved. Also, in a case where the N$_2$ gas is supplied even during the supplying of the TiI$_4$ gas, for example, the flow rate of the N$_2$ gas supplied from the inert gas supply system 230A is set to ½ or more of the flow rate of the TiI$_4$ gas. In addition, the flow rate of the N$_2$ gas supplied during the supplying of the NH$_3$ gas may be set so as to be continuously supplied from the inert gas supply system 230A during the TiN deposition process (step S13 to step S17 in FIG. 4).

Also, in the above-described embodiment, TiI$_4$ has been exemplified as the material of TiN, but metal materials containing other halogen elements such as TiCl$_4$, TiBr$_4$, WF$_6$, WCl$_6$, or HfCl may be used. In addition, the present invention is not limited to the metal material, and it can also be expected that the film quality or the deposition rate will be improved by using silicon-based materials containing halogen elements such as SiCl$_3$H$_2$, SiHCl$_3$, Si$_2$H$_4$Cl$_2$, or Si$_2$Cl$_6$.

Furthermore, the N$_2$ gas has been exemplified as the inert gas, but it is also desirable that, instead of the N$_2$ gas, any of Ar gas, Kr gas, or Xe gas, each of which has a larger molecular weight than the N$_2$ gas, because it is considered that the by-product on the wafer can be efficiently removed as the molecular weight is larger.

As described above, according to the present embodiment, in the process of forming the metal nitride film by alternately supplying the halogen element-containing metal material (TiI$_4$ gas) and the nitrogen-containing material (NH$_3$ gas) to the process chamber 101, the inert gas (N$_2$ gas) is supplied at a predetermined flow rate together with the nitrogen-containing material when the nitrogen-containing material is supplied to the process chamber 101. The flow rate of the inert gas is set to be more increased than the flow rate of the inert gas (including the case where the flow rate is zero) supplied during other processes. That is, by additionally supplying the N$_2$ gas during the supplying of the NH$_3$ gas, the total flow rate of the supply gas is increased while suppressing the partial pressure of the NH₃ gas. Therefore, according to the present embodiment, the halogen element-containing by-product can be effectively removed from the surface of the wafer, and the electrical resistivity can be reduced by suppressing the ratio of the halogen element included in the metal nitride film (TiN). In addition, the halogen element-containing by-product can be effectively removed from the surface of the wafer, thereby improving the deposition rate. As described above, the same effect can also be expected in such a manner that, when the metal material is supplied to the process chamber 101, the inert gas is supplied together with the corresponding metal material at a predetermined flow rate (a flow rate larger than a flow rate (including zero) of the inert gas supplied during other processes).

In particular, the above-described effect can be more effectively obtained by using TiI₄, of which the binding energy of halogen element is small, as the material of TiN, instead of TiCl₄ that is the conventional typical material.

In addition, if a new material is adopted in an existing production line, an integration problem (processing, thermal stability, diffusion stability, etc.) occurs, but the deposition process of the present embodiment can avoid an integration problem because the deposition process is based on the deposition process of the TiN film that is an existing metal nitride film (metal nitride film formed using TiCl₄ as a material).

Furthermore, the present invention can be realized, for example, even by modifying a gas supply system of an existing substrate processing apparatus installed in a semiconductor device manufacturing factory and changing a process recipe. In a case where the process recipe is changed, the process recipe according to the present invention can be installed on the existing substrate processing apparatus via electric telecommunication lines or recording media storing the corresponding process recipe, or an input/output device of the existing substrate processing apparatus can be operated and the process recipe itself can be changed to the process recipe according to the present invention.

The deposition technology has been described above as various exemplary embodiments of the present invention, but the present invention is not limited to those embodiments. For example, in the present embodiment, the single wafer type apparatus has been described as an example of the substrate processing apparatus, but the present invention can also be equally applied to a vertical processing apparatus that processes a plurality of substrates at a time and the like.

(Preferred Aspects of the Present Invention)

Hereinafter, preferred aspects of the present invention will be additionally described.

Embodiment 1

According to an aspect of the present invention, there is provided a substrate processing apparatus including: a process chamber configured to process a substrate; a metal material supply system configured to supply a metal material containing a halogen element and a metal element to the process chamber; a nitrogen-containing material supply system configured to supply a nitrogen-containing material to the process chamber; an inert gas supply system configured to supply an inert gas to the process chamber; and a control unit configured to control the metal material supply system, the nitrogen-containing material supply system, and the inert gas supply system such that the metal material and the nitrogen-containing material are alternately supplied to the process chamber, and a flow rate of the inert gas supplied to the process chamber when the nitrogen-containing material is supplied to the process chamber is more increased than a flow rate of the inert gas supplied to the process chamber when the metal material is supplied to the process chamber.

Embodiment 2

According to other aspect of the present invention, there is provided a substrate processing apparatus including: a process chamber configured to process a substrate; a metal material supply system configured to supply a metal material containing a halogen element and a metal element to the process chamber; a nitrogen-containing material supply system configured to supply a nitrogen-containing material to the process chamber; an inert gas supply system configured to supply an inert gas to the process chamber; and a control unit configured to control the metal material supply system, the nitrogen-containing material supply system, and the inert gas supply system such that the metal material and the nitrogen-containing material are alternately supplied to the process chamber, and a flow rate of the inert gas supplied to the process chamber when the metal material is supplied to the process chamber is more increased than a flow rate of the inert gas supplied to the process chamber when the nitrogen-containing material is supplied to the process chamber.

Embodiment 3

The substrate processing apparatus according to Embodiment 1, wherein the halogen element is a halogen element having a larger atomic number than chlorine (Cl).

Embodiment 4

The substrate processing apparatus according to Embodiment 1, wherein the metal material is titanium iodide (TiI₄) that contains iodine (I) as the halogen element and contains titanium (Ti) as the metal element.

Embodiment 5

The substrate processing apparatus according to Embodiment 1, wherein the inert gas contains an element having a larger molecular weight than nitrogen.

Embodiment 6

The substrate processing apparatus according to Embodiment 1, wherein the control unit is configured to control the inert gas supply system such that, when the nitrogen-containing material is supplied to the process chamber, the flow rate of the inert gas becomes ½ or more of the flow rate of the nitrogen-containing material.

Embodiment 7

The substrate processing apparatus according to Embodiment 1, wherein the control unit is configured to control the inert gas supply system such that, when the metal material is supplied to the process chamber, the flow rate of the inert gas becomes ½ or more of the flow rate of the metal material.

Embodiment 8

The substrate processing apparatus according to Embodiment 1, further comprising a heating unit configured to heat a substrate accommodated in the process chamber, wherein the control unit is configured to control the heating unit such that, when the metal material, the nitrogen-containing material, and the inert gas are supplied to the process chamber, a temperature of the substrate is in a range of 350° C. to 400° C.

Embodiment 9

According to other aspect of the present invention, there is provided a method of manufacturing a semiconductor device, including: supplying a metal material containing a halogen element and a metal element together with an inert gas to a substrate accommodated in a process chamber; and supplying a nitrogen-containing material together with the inert gas to the substrate accommodated in the process chamber, wherein a flow rate of the inert gas supplied when the nitrogen-containing material is supplied is more increased than a flow rate of the inert gas supplied when the metal material is supplied.

Embodiment 10

According to other aspect of the present invention, there is provided a method of manufacturing a semiconductor device, including: supplying a metal material containing a halogen element and a metal element together with an inert gas to a substrate accommodated in a process chamber; and supplying a nitrogen-containing material together with the inert gas to the substrate accommodated in the process chamber, wherein a flow rate of the inert gas supplied during the supplying of the metal material is more increased than a flow rate of the inert gas supplied during the supplying of the nitrogen-containing material.

Embodiment 11

According to other aspect of the present invention, there is provided a method of manufacturing a semiconductor device, including: supplying a metal material containing a halogen element and a metal element together with an inert gas to a substrate accommodated in a process chamber; exhausting the metal material supplied to the process chamber, while supplying the inert gas; supplying a nitrogen-containing material together with the inert gas to the substrate accommodated in the process chamber; and exhausting the nitrogen-containing material supplied to the process chamber, while supplying the inert gas, wherein a flow rate of the inert gas supplied during at least one of the supplying of the metal material and the supplying of the nitrogen-containing material is more increased than a flow rate of the inert gas supplied during the exhausting of the metal material and the exhausting of the nitrogen-containing material.

Embodiment 12

The method according to Embodiment 9, wherein the halogen element is a halogen element having a larger atomic number than chlorine (Cl).

Embodiment 13

The method according to Embodiment 9, wherein the metal material is titanium iodine ($TiI_4$) that contains iodine (I) as the halogen element and contains titanium (Ti) as the metal element.

Embodiment 14

The method according to Embodiment 9, wherein the inert gas contains an element having a larger molecular weight than nitrogen.

Embodiment 15

The method according to Embodiment 9, wherein, when the nitrogen-containing material is supplied, the inert gas is supplied at ½ or more of a flow rate of the nitrogen-containing material.

Embodiment 16

The method according to Embodiment 9, wherein, when the metal material is supplied, the inert gas is supplied at ½ or more of a flow rate of the metal material.

Embodiment 17

The method according to Embodiment 9, wherein the supplying of the metal material and the supplying of the nitrogen-containing material are performed when a temperature of the substrate accommodated in the process chamber is in a range of 350° C. to 400° C.

Embodiment 18

According to other aspect of the present invention, there is provided a program causing a computer to perform or a non-transitory computer-readable recording medium storing the program: a process of supplying a metal material containing a halogen element and a metal element together with an inert gas to a substrate accommodated in a process chamber; and a process of supplying a nitrogen-containing material to the substrate accommodated in the process chamber together with an inert gas, a flow rate of which is larger than a flow rate of the inert gas supplied together with the metal material.

Embodiment 19

According to other aspect of the present invention, there is provided a program causing a computer to perform or a non-transitory computer-readable recording medium storing the program: a process of supplying a nitrogen-containing material together with an inert gas to a substrate accommodated in a process chamber; and a process of supplying a metal material containing a halogen element and a metal element to the substrate accommodated in the process chamber together with an inert gas, a flow rate of which is larger than a flow rate of the inert gas supplied together with the nitrogen-containing material.

The present invention can be used in, for example, a substrate processing apparatus for processing a substrate such as a silicon wafer, a method of manufacturing a semiconductor device, or the like.

What is claimed is:

1. A method of manufacturing a semiconductor device, comprising:
   supplying a halogen-containing metal material containing a metal element and a halogen element to a substrate while supplying an inert gas;
   supplying a reactant gas containing a nitrogen element to the substrate while supplying the inert gas at a flow rate larger than a flow rate of the inert gas supplied during the supplying of the halogen-containing metal material;
   forming a metal-containing nitride film on the substrate by performing a cycle a predetermined number of times, the cycle including:
   supplying the halogen-containing metal material;
   removing the halogen-containing metal material;
   supplying the reactant gas; and removing the reactant gas,
wherein a flow rate of the inert gas supplied during the supplying of the reactant gas is larger than a flow rate of the inert gas supplied during the supplying of the halogen-containing metal material, a flow rate of the inert gas supplied during the removing of the halogen-containing metal material, and a flow rate of the inert gas supplied during the removing of the reactant gas.

2. The method according to claim 1, wherein the flow rate of the inert gas supplied during the supplying of the halogen-containing metal material is larger than the flow rate of the inert gas supplied during the removing of the halogen-containing metal material and the flow rate of the inert gas supplied during the removing of the reactant gas.

3. The method according to claim 1, wherein, when the reactant gas is supplied, the inert gas is supplied at ½ or more of a flow rate of the reactant gas.

4. The method according to claim 1, wherein, when the halogen-containing metal material is supplied, the inert gas is supplied at ½ or more of a flow rate of the halogen-containing metal material.

5. The method according to claim 1, wherein the halogen element has a smaller binding energy than chlorine.

6. The method according to claim 5, wherein the halogen element is one selected from the group consisting of iodine and bromine.

* * * * *